United States Patent [19]

Han et al.

[11] Patent Number: 5,617,043

[45] Date of Patent: Apr. 1, 1997

[54] OUTPUT BUFFER WITH REFERENCE VOLTAGE CIRCUIT FOR INCREASING SPEED

[75] Inventors: Gwang M. Han; Dae Y. Moon, both of Kyoungki-do, Rep. of Korea

[73] Assignee: Hyundai Electronics Industries Co., Ltd., Kyoungki-do, Rep. of Korea

[21] Appl. No.: 575,234

[22] Filed: Dec. 20, 1995

Related U.S. Application Data

[63] Continuation of Ser. No. 174,135, Dec. 28, 1993, abandoned.

[30] Foreign Application Priority Data

Dec. 31, 1992 [KR] Rep. of Korea .................... 92-27075

[51] Int. Cl.$^6$ .................... H03K 19/017; H03K 19/0948
[52] U.S. Cl. .................... 326/83; 326/17; 326/58; 326/87
[58] Field of Search .................... 307/443, 451, 307/473; 326/17, 26, 57–58, 83, 86–87, 121

[56] References Cited

U.S. PATENT DOCUMENTS

| | | | |
|---|---|---|---|
| 4,570,091 | 2/1986 | Yasuda et al. | 307/473 |
| 4,983,860 | 1/1991 | Yim et al. | 307/451 |
| 4,988,888 | 1/1991 | Hirase et al. | 307/451 |
| 5,311,076 | 5/1994 | Park et al. | 307/443 |

*Primary Examiner*—Edward P. Westin
*Assistant Examiner*—Jon Santamauro
*Attorney, Agent, or Firm*—Morgan & Finnegan, L.L.P.

[57] ABSTRACT

A data output buffer rapidly transits an output data signal to improve the data reading speed of a semiconductor memory device. To do this, the data output buffer comprises a first input terminal for receiving true data, a second input terminal for receiving complementary data, a pull-up MOS transistor connected between a first power supply and an output line and being driven by the true data from the first input terminal, a pull-down MOS transistor connected between a second power supply and the output line and being driven by the complementary data from the second input terminal, a reference logic voltage generator for supplying a reference logic voltage to the output line, and a controller for driving the reference logic voltage generator, by the true data from the first input terminal and the complementary data from the second input terminal to be complementary to the pull-up MOS transistor and the pull-down MOS transistor.

11 Claims, 6 Drawing Sheets

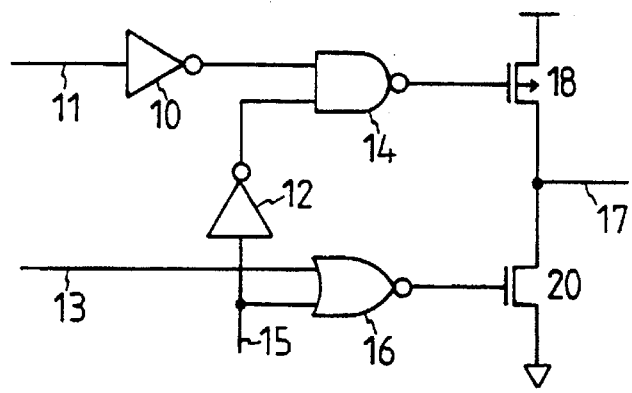
PRIOR ART
Fig. 1
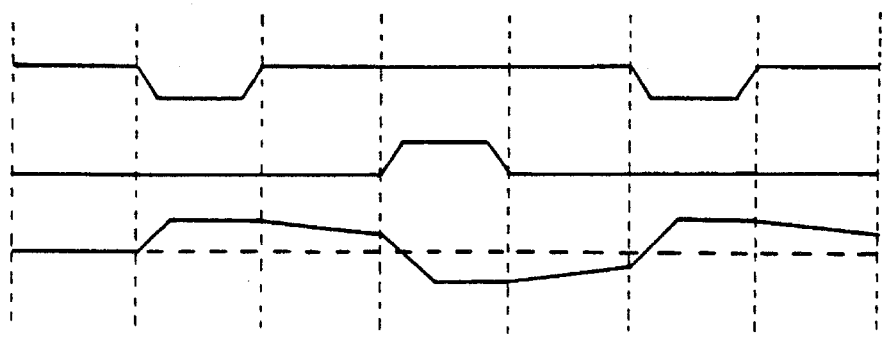
PRIOR ART
Fig. 2A
PRIOR ART
Fig. 2B
PRIOR ART
Fig. 2C

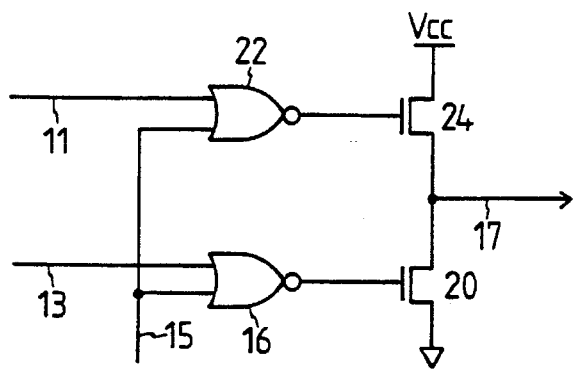
PRIOR ART
Fig. 3
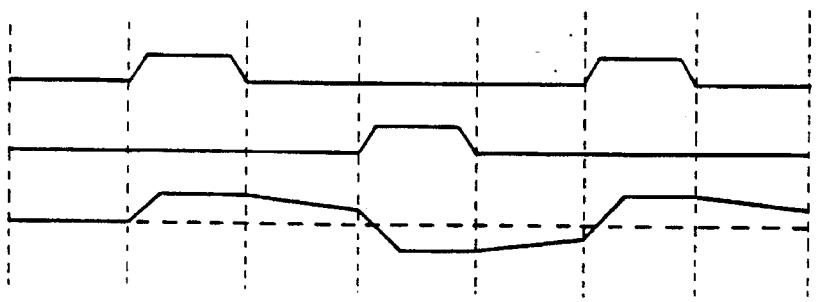
PRIOR ART
Fig. 4A
PRIOR ART
Fig. 4B
PRIOR ART
Fig. 4C

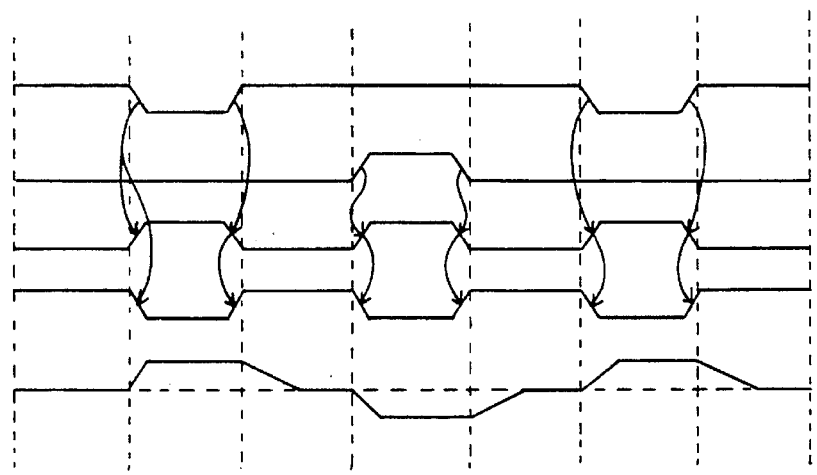
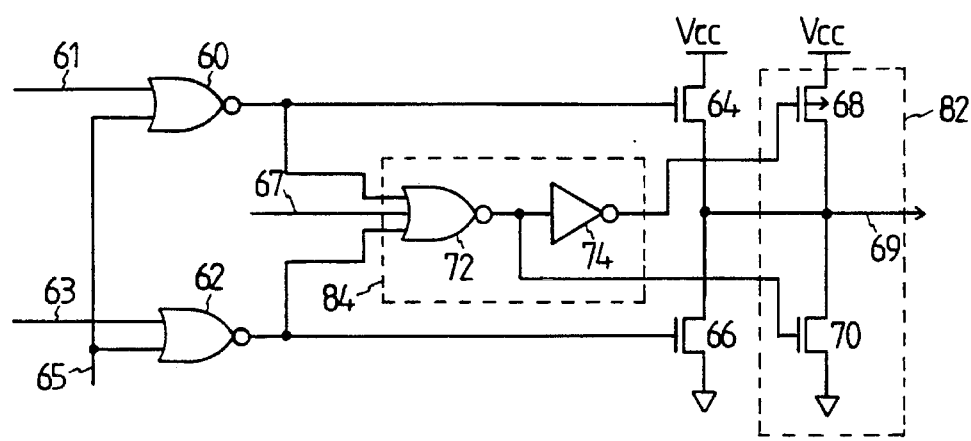
Fig. 8

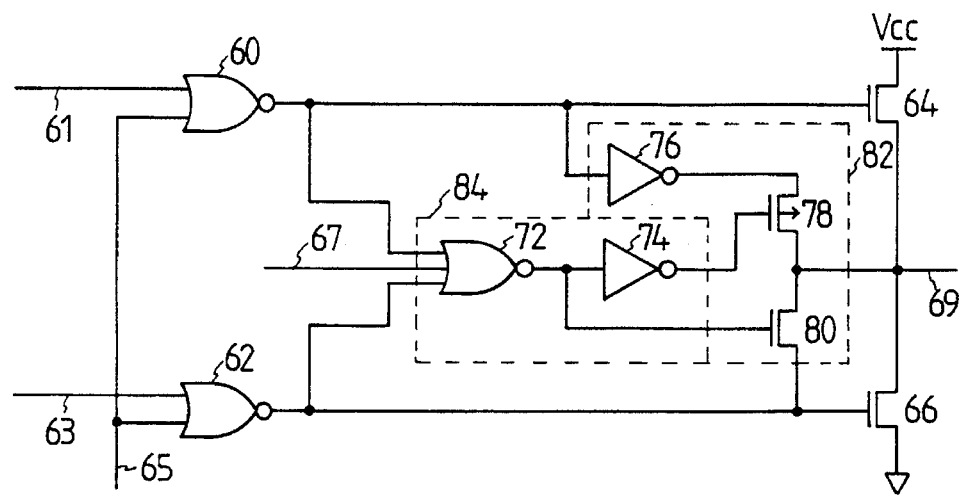
Fig. 9
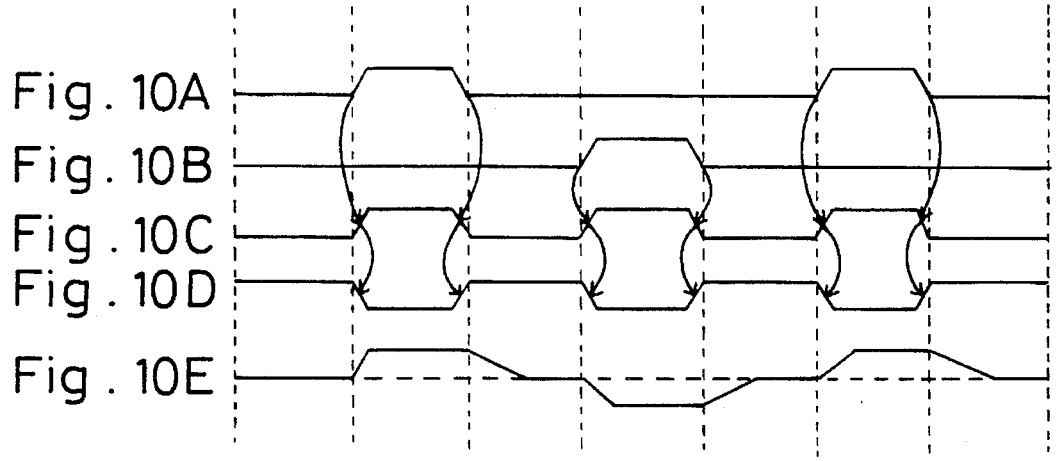
Fig. 10A
Fig. 10B
Fig. 10C
Fig. 10D
Fig. 10E

OUTPUT BUFFER WITH REFERENCE VOLTAGE CIRCUIT FOR INCREASING SPEED

This is a continuation of application Ser. No. 08/174,135, filed on Dec. 28. 1993, now abandoned.

BACKGROUND OF THE INVENTION

1. Field of the Invention

The present invention relates to a data output buffer, in semiconductor memory device, for transmitting data read out from memory cells to an external logic circuit, and more particularly to a data output buffer that can improve the reading speed of a semiconductor memory device by improving the transition speed of output data.

2. Description of the Prior Art

A general data output buffer included in the semiconductor memory device converts true and complementary data signals from memory cells to a three-logic output data signal. The conventional data output buffer supplies the converted data signal to an external logic circuit via an output terminal. The output data signal generated by the conventional data output buffer has high logic of a predetermined voltage level when the true data signal has a specific logic, and has low logic of grounded potential GND when the complementary data signal has a specific logic. The output data signal of the data output buffer has a reference logic of high impedance when both the true and complementary data signals have ground logic.

However, the conventional data output buffer cannot maintain high impedance, due to the input impedance of external logic circuit connected to the output terminal, the impedance of transmission line connected between the output terminal and the external logic circuit, etc. The reference logic of high logic has a voltage level which is gradually increased from low logic of grounded potential or a voltage level which is gradually decreased from high logic of specific voltage, due to the impedance of transmission line and the input impedance of external logic circuit. Because of this, the conventional data output buffer creates a large transition voltage width and a long transition interval of the output data, and thereby decreases the data reading speed of semiconductor memory device. The problem of the above conventional data output buffer is described with reference to the attached drawings.

FIG. 1 illustrates a conventional data output buffer which has a first invertor 10 for inverting a true data signal from a first input line 11, a second invertor 12 for inverting an output enable signal from a control line 15, and a NAND gate 14 for receiving the inverted true data signal and the inverted output enable signal from the first and second inverters 10 and 12. The NAND gate 14 NAND-gates the inverted true data and the inverted output enable signal and supplies the NAND-gated signal to a pull-up PMOS transistor 18. As shown in FIG. 2A, the NAND-gated logic signal has low logic when both the inverted true data signal and the inverted output enable signal have high logic. The pull-up PMOS transistor 18 opens and closes a current path of first power supply voltage Vcc that will be supplied from the first power supply Vcc to the output line 17 according to the logic value of the logic signal from the NAND gate 14.

The conventional data output buffer additionally comprises a NOR gate 16 for receiving the complementary data signal from the second input line 13 and the output enable signal from the control line 15, and a pull-down NMOS transistor 20 connected between the output line 17 and the second power supply GND. The NOR gate 16 NOR-gates the complementary data signal and the output enable signal and supplies the NOR-gated logic signal to the gate of pull-down NMOS transistor 20. As shown in FIG. 2B, the logic signal generated in the NOR gate 16 has high logic when both the complementary data signal and the output enable signal have low logic. The pull-down NMOS transistor 20 opens and closes a current path of the second power supply voltage GND that will be supplied from the second power supply GND to the output line 17, according to the logic value of the logic signal from the NOR gate 16.

The output data signal generated in output line 17 maintains the first power supply voltage Vcc supplied via the pull-up PMOS transistor 18 while the pull-up PMOS transistor 18 is turned on. On the other hand, while the pull-down NMOS transistor 20 is turned on, the output line 17 has the second power supply voltage GND supplied via the pull-down NMOS transistor 20. While both the MOS transistors 18 and 20 are turned off, the output data signal generated in the output line 17 has voltage gradually decreased from the first power supply voltage Vcc or voltage gradually increased from the second power supply voltage GND, as shown in FIG. 2C. The reason why the output data signal has the voltage gradually increased from the first power supply voltage Vcc and the voltage gradually increased from the second power supply voltage during the turning-off of both MOS transistor 18 and 20 is due to the capacitance and resistance input impedance of the external logic circuit connected to output line 17.

FIG. 3 shows a conventional data output buffer which has a pull-up NMOS transistor 24 instead of the pull-up PMOS transistor 18 as shown in FIG. 1, and a NOR gate 22 instead of the NAND gate 14 and two inverters 10 and 12 as shown in FIG. 1. The NOR gate 22 generates a "high" logic signal, as shown in FIG. 4A, when both the true data from the first input line 11 and the output enable signal from the control line 15 have low logic. The pull-up NMOS transistor 24 supplies the first power supply voltage Vcc from the first power supply Vcc to the output line 17 while the logic signal from the NOR gate 22 maintains high logic.

The NOR gate 16 generates a "high" logic signal, as shown in FIG. 4B, when both the complementary data from the second input line 13 and the output enable signal from the control line 15 have low logic. Then, the pull-down NMOS transistor 20 supplies the second power supply voltage GND from the second power supply GND from the output line 17, in response to a "high" logic signal from the NOR gate 16.

The output data signal generated in the output line 17 maintains the first power supply voltage Vcc supplied via the pull-up NMOS transistor 24 while the pull-up NMOS transistor 24 is turned on. On the other hand, while the pull-down NMOS transistor 20 is turned on, the output line 17 has the second power supply voltage GND supplied via the pull-down NMOS transistor 20. While both the MOS transistors 20 and 24 are turned off, the output data signal generated in the output line 17 has the voltage gradually reduced from the first power supply voltage Vcc or the voltage gradually increased from the second power supply voltage GND, as shown in FIG. 4C. The reason why the output data signal has the voltage gradually reduced from the first power supply voltage Vcc and the voltage gradually increased from the second power supply voltage GND during the turning-off of both transistors 20 and 24 is due to the capacitance and resistance input impedance of the external logic circuit connected to the output line 17.

As described above, the conventional data output buffer cannot maintain the high impedance state, i.e., the reference logic level, due to the input impedance of the external logic circuit connected to the output line, and generates the output data signal having the reference logic of the voltage level being nearly equal to the voltage level of high logic or the voltage level of low logic. This increases the voltage difference between the reference logic and the high logic and the voltage difference between the reference logic and the low logic, and reduces the transition speed of output data signal of the data output buffer. The decrement in the transition speed of the output data signal of the data output buffer deteriorates the data reading speed of the semiconductor memory device.

SUMMARY OF THE INVENTION

It is an object of the present invention to provide a data output buffer that can rapidly transmit the output data signal so as to improve the data reading speed of the semiconductor memory device.

To achieve the object, the data output buffer of the present invention comprises first input means for receiving true data, second input means for receiving complementary data, pull-up control impedance means connected between a first power supply and an output line being driven by the true data from the first input means, pull-down control impedance means connected between a second power supply and the output line being driven by the complementary data from the second input means reference logic voltage generation means for supplying a reference logic voltage to the output line, and control means for driving the reference logic voltage generation means to be complementary to the pull-up control impedance means and the pull-down control impedance means, by the true data from the first input means and the complementary data from the second input means.

BRIEF DESCRIPTION OF THE DRAWINGS

The above object and other advantage of the present invention will become more apparent by describing the preferred embodiments of the present invention with reference to the attached drawings, in which:

FIG. 1 is a circuit diagram of a conventional data output buffer;

FIGS. 2A through 2C are output waveform diagrams at the respective portions of the circuit as shown in FIG. 1;

FIG. 3 is a circuit diagram of another data output buffer having a different constitution;

FIGS. 4A through 4C are output waveform diagrams at the respective portions as shown in FIG. 3;

FIGS. 7A through 7E are output waveform diagrams at the respective portions of the circuits as shown in FIGS. 5 and 6;

FIG. 8 is a circuit diagram of the data output buffer according to the third embodiment of the present invention;

FIG. 9 is a circuit diagram of the data output buffer according to the fourth embodiment of the present invention;

FIGS. 10A through 10E are output waveform diagrams at the respective portions of the circuits as shown in FIGS. 8 and 9.

DETAILED DESCRIPTION OF THE INVENTION

Figure 5:
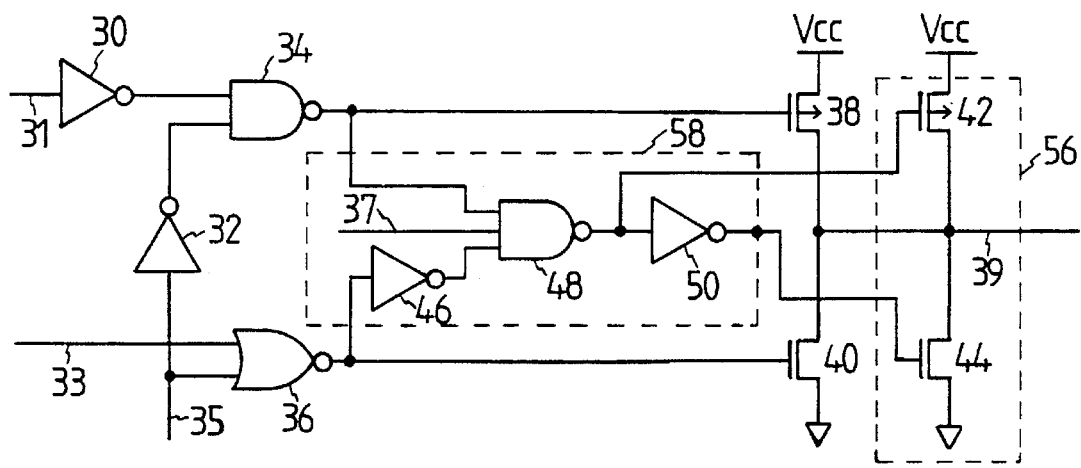
FIG. 5 is a circuit diagram of a data output buffer according to the first embodiment of the present invention.

Turning now to FIG. 5, the data output buffer, in accord with the embodiments of the present invention, has a first invertor 30 for receiving a true data signal from a first input line 31, a second invertor 32 for receiving an output enable signal from a first control line 35, and a pull-up PMOS transistor 38 connected between a first power supply Vcc and an output line 39. The first invertor 30 inverts the true data signal and supplies the inverted true data signal to a first NAND gate 34. The first NAND gate 34 NAND-gates the inverted true data signal from the first invertor 30 and the enable signal, i.e., the inverted output from the second invertor 32, and supplies the NAND-gated logic signal to the gate of the pull-up PMOS transistor 38. The pull-up PMOS transistor 38 is turned on when the logic signal from the first NAND gate 34 has low logic. The pull-up PMOS transistor 38 supplies the first power supply voltage Vcc from the first power supply Vcc to the output line 39. As shown in FIG. 7A, the logic signal generated in the first NAND gate 34 has low logic when both the inverted true data signal and the inverted output enable signal have high logic (i.e., when data having logic value "1" is supplied). On the other hand, when the inverted true data signal and/or the inverted output enable signal has low logic, the logic signal generated in the first NAND gate 34 has high logic.

The data output buffer, according to the embodiments, additionally has a NOR gate 36 for receiving a complementary data signal from a second input line 33, and a pull-down NMOS transistor 40 connected between a second power supply GND and the output line 37. The NOR gate 40 NOR-gates the complementary data signal from the first input line 33 and the output enable signal from the first control line 35, and supplies the NOR-gated logic signal to the gate of the pull-down NMOS transistor 40. The pull-down NMOS transistor 40 is turned on when the logic signal from the NOR gate 36 has high logic. The pull-down NMOS transistor 40 supplies the second power supply voltage GND from the second power supply GND to the output line 39. The logic signal generated in the NOR gate 36 has high logic, as shown in FIG. 7B, when both the complementary data signal and the output enable signal have low logic (i.e., when data having logic value "0" is supplied). On the other hand, when the complementary data signal and/or the output enable signal has high logic, the logic signal generated in the NOR gate 36 has low logic.

Also, the data output buffer, according to the embodiments, has a reference logic voltage generator 56 for supplying a reference logic voltage to the output line 39, and a controller 58 for controlling the reference logic voltage generator 56. The controller 58 has a third invertor 46 for inverting a logic signal from the NOR gate 36, and a second NAND gate 48 for receiving a write enable signal from the second control line 37. The second NAND gate 48 NAND-gates the logic signals from the third invertor 46 and the first NAND gate 34, and the read enable signal from the second control line 37, and generates a first control signal for controlling the reference logic voltage generator 56. The second NAND gate 48 supplies the first control signal to the fourth invertor 50 and the reference logic voltage generator 56. The fourth invertor 50 inverts the first control signal from the second NAND gate 48 and supplies the inverted first control signal as a second control signal to the reference logic voltage generator 56. The first control signal has low logic, when all of the output logic signal of the third invertor 46, the output logic signal of the first NAND gate 34, and the write enable signal have high logic (i.e., during in a read mode and when data of logic values "0" and "1" are not supplied), as shown in FIG. 7C. On the other hand, when the output logic signal of the first NAND gate 34, the output logic signal of the third invertor 46, and/or the write enable signal have low logic (i.e., during in a write mode, or when data signal having logic value "0" or "1" is supplied to the first and second input lines 3 and 33), the first control signal has high logic. The second control signal has a logic, being opposite to the logic of the first control signal. Also, the write enable signal has low logic when the semiconductor memory device is in a write mode.

The reference logic voltage generator 56 has a PMOS transistor 42 connected between the first power supply Vcc and the output line 38, and a NMOS transistor 44 connected between the output line 39 and the second power supply GND. The PMOS transistor 42 is turned on, in response to the "low"-logic first control signal from the second NAND gate 48. The NMOS transistor 44, together with the PMOS transistor is turned on, in response to the "high"-logic second control signal from the fourth invertor 50. As a result, the PMOS transistor 42 and the NMOS transistor 44 divide the first power supply voltage Vcc when no data signal "0" or "1" is supplied to the first and second input lines 31 and 33, and supplies the divided voltage Vd to the output line 39 as a reference logic voltage. The voltage Vd divided by the PMOS transistor 42 and the NMOS transistor 44 is determined by the following equation (1):

$$Vd = R44 \cdot Vcc/(R42+R44) \tag{1}$$

In equation (1), R42 is a resistance of the PMOS transistor 42, and R44 is a resistance of the NMOS transistor 44. The PMOS transistor 42 and the NMOS transistor 44 have the same channel width such that the divided voltage Vd has the voltage level Vcc/2.

The output data signal generated in the output line 39 maintains the divided voltage Vd when no data having logic values "0" or "1" are supplied to the first and second input lines 31 and 33. When the data of logic value "1" is entered to the first and second input lines 31 and 33, the output data signal has the first power supply voltage Vcc. Also, the output data signal has the second power supply voltage GND when the data of logic value "0" is entered to the first and second input lines 31 and 33.

Figure 6:
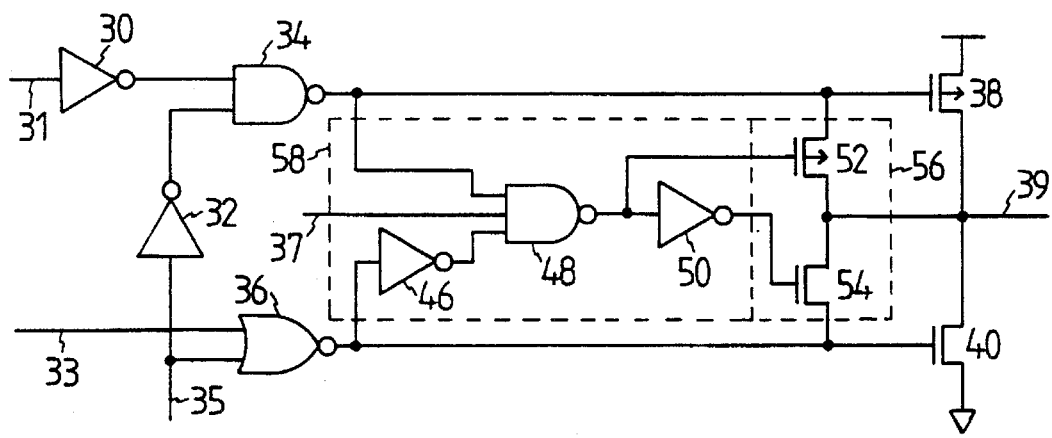
FIG. 6 is a circuit diagram of a data output buffer according to the second embodiment of the present invention.

The data output buffer, according to the second embodiment of the present invention as shown in FIG. 6, has the same constitution and components as the data output buffer of FIG. 5, except that the reference logic voltage generator 56 is connected-between the output terminal of the first NAND gate 34 and the output terminal of the NOR gate 36. The reference logic voltage generator 56 has a PMOS transistor 52 connected between the output terminal of the first NAND gate 34 and the output line 39, and a NMOS transistor 54 connected between the output line 39 and the output terminal of the NOR gate 36. The PMOS transistor 52 is turned on in response to the "low"-logic first control signal from the second NAND gate 48. The NMOS transistor 54, simultaneously with the PMOS transistor 52 is turned on in response to the "high"-logic second control signal from the fourth invertor 50.

Accordingly, the PMOS transistor 52 and the NMOS transistor 54 voltage-divide the difference voltage between a high logic voltage Vh from the first NAND gate 34 and a low logic voltage Vl from the NOR gate 36 and transmit the voltage-divided difference voltage Vdc to the output terminal 39. The voltage-divided difference voltage Vdc is determined to have the voltage level Vcc/2 by the following equation (2):

$$Vdc = R54 \cdot (Vh-Vl)/(R52+R54) \tag{2}$$

In equation (2), R52 and R54 are resistance values of the PMOS and NMOS transistors 52 and 54. The channel widths of the PMOS and NMOS transistors 52 and 54 are properly set, such that the voltage-divided difference voltage Vdc has the voltage level Vcc/2.

FIG. 8 shows the data output buffer according to the third embodiment of the present invention, which has a first NOR gate 60 for receiving a true data signal and an output enable signal from a first input line 62 and a first control line 65, and a pull-up NMOS transistor 64 connected between a first power supply Vcc and an output line 69. The first NOR gate 60 NOR-gates the true data signal and the output enable signal and supplies the NOR-gated logic signal to the gate of the pull-up NMOS transistor 64. The logic signal generated in the first NOR gate 60 has high logic, as shown in FIG. 10A, when both the true data signal and the output enable signal have low logic (i.e., when data of logic value "1" is entered to the first and second input lines 61 and 63). When the true data signal and/or the output enable signal has low logic (during a read mode, or when data of logic value "0" is entered to the first and second input lines 61 and 63), the logic signal generated in the first NOR gate 60 has low logic. The pull-up NMOS transistor 64 is turned on in response to the "high"-logic signal from the first NOR gate 60. The pull-up NMOS transistor 64 supplies the first power supply voltage Vcc from the first power supply Vcc to the output line 69.

The data output buffer according to the third embodiment has a second NOR gate 62 for receiving a complementary data signal and an output enable signal from the second input line 63 and the first control line 65, and a pull-down NMOS transistor 66 connected between the output line 69 and the second power supply GND. The second NOR gate 62 NOR-gates the complementary data signal and the output enable signal and supplies the NOR-gated logic signal to the gate of the pull-down NMOS transistor 66. The logic signal generated in the second NOR gate 62 has high logic, as shown in FIG. 10B, when both the complementary data signal and the output enable signal have low logic (i.e., when data of logic value "0" is entered to the first and second input lines 61 and 63). When the complementary data signal and/or the output enable signal has low logic (i.e., during a read mode or when data of logic value "1" is entered to the first and second input lines 61 and 63), the logic signal generated in the second NOR gate 62 has a low logic signal. The pull-down NMOS transistor 66 is turned on in response to a high logic signal from the second NOR gate 62. The pull-down NMOS transistor 66 supplies the second power supply voltage GND from the second power supply GND to the output line 69.

Also, the data output buffer according to the third embodiment has a reference logic voltage generator 82 for supplying a reference logic voltage to the output line 69, and a controller 94 for controlling the reference logic voltage generator 82. The controller 84 has a third NOR gate 72 for receiving the output logic signals of the first and second NOR gates 60 and 62, and the read enable signal from the second control line 68. The third NOR gate 72 NOR-gates the output logic signals of the first and second NOR gates 60 and 62 and the read enable signal, and supplies the NOR-gated logic signal as a first control signal to the reference logic voltage generator 82 and the invertor 74. The first control signal generated in the third NOR gate 72 has high logic, as shown in FIG. 10C, when all of the output logic signals of the first and second NOR gates 60 and 62 and the read enable signal have low logic (i.e., when the semiconductor memory device is in a read mode, and no data of logic values "0" and "1" are entered to the first and second input lines 61 and 63). On the other hand, when the read enable signal, the output logic signal of the first NOR gate 60 and/or the output logic signal of the second NOR gate 62 have high logic (i.e., when the semiconductor memory device is in a write mode, or when data of logic value "0" or "1" is entered to the first and second input lines 61 and 63), the first control signal has low logic. The invertor 74 inverts the first control signal from the third NOR gate 72, and then supplies the inverted first control signal as a second control signal to the reference logic voltage generator 82, as shown in FIG. 10D.

The reference logic voltage generator 82 has a PMOS transistor 68 connected between the first power supply Vcc and the output line 69, and a NMOS transistor 70 connected between the output line 69 and the second power supply GND. The PMOS transistor 69 is turned on in response to the "low"-logic second control signal from the invertor 74. The NMOS transistor 70 with the PMOS transistor 68 is turned on in response to the "high"-logic first control signal from the third NOR gate 72. Accordingly, the PMOS transistor 68 and the NMOS transistor 70 voltage-divides the first power supply voltage Vcc while no data signals "0" and "1" are entered to the first and second input lines 61 and 63, in a read mode, and supplies the voltage Vd as a reference logic voltage to the output line 69. The voltage Vd voltage-divided by the PMOS transistor 68 and the NMOS transistor 70 is determined by the following equation (3):

$$Vd = R70 \cdot Vcc/(R69 + R70) \qquad (3)$$

In equation (3), R68 and R70 are resistance values of the PMOS transistor 68 and the NMOS transistor 70. The PMOS transistor 68 and the NMOS transistor 70 have the same channel width, such that the voltage-divided voltage Vd has the voltage level Vcc/2.

As shown in FIG. 10E, the output data signal generated in the output line 69 maintains the voltage-divided voltage Vd, when data of logic values "0" and "1" are not entered to the first and second input lines 61 and 63. When data of logic value "1" is entered to the first and second input liens 61 and 63, the output data signal has a first power supply voltage Vcc. Also, when data of logic value "0" is entered to the first and second input lines 61 and 63, the output data signal has the second power supply voltage GND.

The data output buffer shown in FIG. 9, according to the fourth embodiment of the present invention has the same constitution and components as the data output buffer shown in FIG. 8, except that the reference logic voltage generator 82 is connected between the output terminal of the first NOR gate 69 and the output terminal of the second NOR gate 62. The reference logic voltage generator 82 has an invertor 76 for inverting a logic signal from the output terminal of the first NOR gate 60, a PMOS transistor 78 connected between the invertor 76 and the output line 69, and a NMOS transistor 80 between the output line 69 and the output terminal of the second NOR gate 62. The invertor 76 makes the output logic signal of the first NOR gate 60 and the output logic signal of the second NOR gate 62 have opposite-logic voltages, when the semiconductor memory device is in a read mode and the data of logic values "0" and "1" are not entered to the first and second input lines 61 and 63. The PMOS transistor 78 is turned on in response to the "low"-logic second control signal from the invertor 74 and attenuates the high logic voltage that will be transmitted from the invertor 76 to the output line 69. The NMOS transistor 80, simultaneously with the PMOS transistor 78 is turned on in response to the "high"-logic first control signal from the third NOR gate 72. The NMOS transistor 80 attenuates the low logic voltage supplied from the second NOR gate 62 to the output line 69. Accordingly, the PMOS transistor 78 and the NMOS transistor 80 voltage-divide the difference voltage between the high logic voltage Vh from the invertor 76 and the low logic voltage Vl from the second NOR gate 62, and transmits the voltage-divided difference voltage Vdc to the output terminal 69. The voltage-divided difference voltage Vdc is determined to have the voltage level Vcc/2 by the following equation (4):

$$Vdc = R80 \cdot (Vh - Vl)/(R78 + R80) \qquad (4)$$

In equation (4), R78 and R80 are resistance values of the PMOS and NMOS transistors 78 and 80. The channel widths of the PMOS and NMOS transistors 78 and 80 are properly set, such that the voltage-divided difference voltage Vdc has the voltage level Vcc/2.

Figure 11:
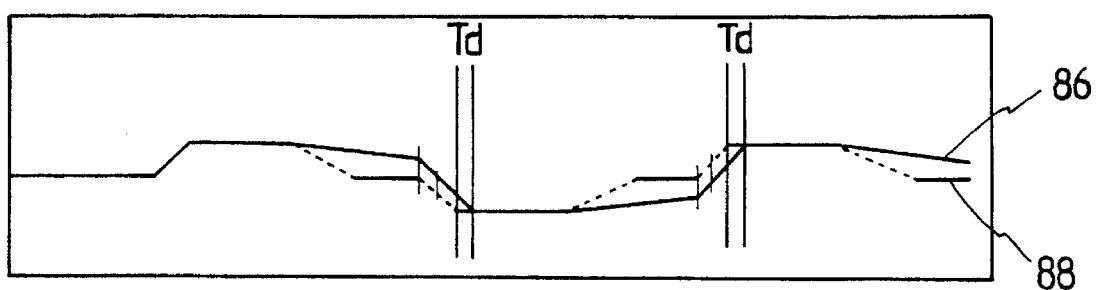
FIG. 11 is a waveform diagram for comparing the output data signals from the conventional data output buffer and the data output buffer according to the embodiment of the present invention.

FIG. 11 illustrates the output data signal 88 generated in the present data output buffer to be compared with the output data signal generated in the conventional data output buffer. In the output data signal 88 of the present invention, the transition from high logic of Vcc voltage level to reference logic of Vcc/2 voltage level, and the transition from low logic of GND voltage level to reference logic of Vcc/2 voltage level are clearly generated. However, in the output data signal of the conventional data output buffer, the transition from high logic of Vcc voltage level to high-impedance reference logic level, and the transition from low logic of GND voltage level to high-impedance reference logic level are not clearly generated. Because of this reason, the output signal 88 of the data output buffer according to the present invention has a much smaller transition voltage width from the reference logic to the high logic and low logic, than the output data signal 86 of the conventional data output buffer. The output data signal 88 of the present data output buffer has a smaller transition interval from the reference logic to the high logic and low logic than the output data signal 86 of the conventional data output buffer, by the time period Td.

As described above, the present invention sets the reference logic voltage to a voltage level between high logic and low logic, to make clear the transition from high logic and low logic to reference logic in output data signal be clear. The present invention decreases the transition voltage width of output data signal from reference logic to high logic and low logic, and shortens the transition interval of output data signal from reference logic to high logic and low logic. Accordingly, the present invention provides the advantage of improving the reading speed of the semiconductor memory device.

What is claimed is:

1. A data output buffer comprising:

a first input means for receiving a true data;

second input means for receiving a complementary data;

pull-up control impedance means connected between a first power supply and an output line and being driven by said first input means according to said true data;

pull-down control impedance means connected between a second power supply and said output line and being driven by said second input means according to said complementary data;

reference logic voltage generation means for supplying a reference logic voltage to said output line; and control means for driving said reference logic voltage generation means, by said first input means according to said true data and said second input means according to said complementary data, to be complementary to said pull-up control impedance means and said pull-down control impedance means.

2. A data output buffer as claimed in claim 1, wherein said reference logic voltage generation means voltage-divides a difference voltage between a first power supply voltage and a second power supply voltage and supplies said voltage-divided difference voltage to said output line.

3. A data output buffer as claimed in claim 2, wherein said reference logic voltage generation means comprises a first MOS transistor connected between said first power supply and said output line and being driven under the control of said control means, and a second MOS transistor connected between said output line and said second power supply and being driven under the control of said control means.

4. A data output buffer as claimed in claim 3, wherein said first and second MOS transistors have the equal value in the channel widths.

5. A data output buffer as claimed in claim 4, wherein said control means comprises a logic operation element for logic-operating a signal representative of said true data from said first input means and a signal representative of said complementary data from said second input means to supply said logic-operated signal to said first and second MOS transistors.

6. A data output buffer as claimed in claim 1, wherein said reference logic voltage generation means comprises inverting means for inverting a logic value of true data from said first input means, and voltage-dividing means for voltage-dividing a difference voltage between logic signals from said inverting means and said second input means and supplying said voltage-divided difference voltage signal to said output line, under the control of control means.

7. A data output buffer as claimed in claim 6, wherein said voltage-dividing means comprises a first MOS transistor connected between said inverting means and said output line and being driven under the control of said control means, and a second MOS transistor connected between said output line and said second input means and being driven under the control of said control means.

8. A data output buffer as claimed in claim 7, wherein said first MOS transistor is a P-type MOS transistor;

said second MOS transistor is a N-type MOS transistor; and said control means comprises a logic operation elements for logic-operating said true data from said first-input means and said complementary data from said second input means to supply said logic-operated signal to said first MOS transistor, and second inverting means for inverting said logic-operated signal from said logic operation element to supply said inverted logic-operated signal to said second MOS transistor.

9. A data output buffer comprising:

a first input means for receiving true data;

second input means for receiving complementary data;

pull-up control impedance means connected between a first power supply and an output line and being driven by said first input means according to said true data;

pull-down control impedance means connected between a second power supply and said output line and being driven by said second input means according to said complementary data;

reference logic voltage generation means for supplying a reference logic voltage to said output line, said reference logic voltage generation means comprising inverting means for inverting a logic value of true data from said first input means, and voltage-dividing means for voltage-dividing a difference voltage between logic signals from said inverting means and said second input means and supplying said voltage-divided difference voltage signal to said output line; and control means for driving said reference logic voltage generation means, by said first input means according to said true data and said second input means according to said complementary data, to be complementary to said pull-up control impedance means and said pull-down control impedance means.

10. The data output buffer as claimed in claim 9, wherein said voltage-dividing means comprises a first MOS transistor connected between said inverting means and said output line and being driven under the control of said control means, and a second MOS transistor connected between said output line and said second input means and being driven under the control of said control means.

11. A data output buffer as claimed in claim 10, wherein said first MOS transistor is a P-type MOS transistor;

said second MOS transistor is a N-type MOS transistor; and said control means comprises a logic operation elements for logic-operating said true data from said first input means and said complementary data from said second input means to supply said logic-operated signal to said first MOS transistor, and second inverting means for inverting said logic-operated signal from said logic operation element to supply said inverted logic-operated signal to said second MOS transistor.

* * * * *